United States Patent
Yung et al.

[19]

[11] Patent Number: 5,818,789
[45] Date of Patent: Oct. 6, 1998

[54] DEVICE AND METHOD FOR MEMORY ACCESS

[75] Inventors: Wu Chi Yung; Kuo Chen Yu, both of Hsin Chu, Taiwan

[73] Assignee: Holtek Microelectronics, Inc., Hsin Chu, Taiwan

[21] Appl. No.: 541,808

[22] Filed: Oct. 10, 1995

[51] Int. Cl.$^6$ .............................. G11C 8/00; G11C 17/00
[52] U.S. Cl. ............................ 365/230.06; 365/230.08; 365/94
[58] Field of Search ............... 365/230.06, 230.08, 365/189.05, 220, 221, 94

[56] References Cited

U.S. PATENT DOCUMENTS

| | | | |
|---|---|---|---|
| 4,394,753 | 7/1983 | Penzel | 365/236 |
| 4,410,965 | 10/1983 | Moore | 365/230.06 |

OTHER PUBLICATIONS

Radio Shack, "Semiconductor Reference Guide", p. 95 1982 Edition.

*Primary Examiner*—David C. Nelms
*Assistant Examiner*—Trong Quang Phan
*Attorney, Agent, or Firm*—Laff, Whitesel, Conte & Saret, Ltd.

[57] ABSTRACT

The present invention is related to an interface circuit for transmitting data corresponding to a specific address from/to a decoding memory unit, includes a bit-selection circuit pre-set therein a transmission mode, and a processing circuit electrically connected to the bit-selection circuit for transmitting the data according to the transmission mode. The present invention also relates to methods for reading out and writing in data corresponding to a specific address from/to a decoding memory unit.

2 Claims, 10 Drawing Sheets

DEVICE AND METHOD FOR MEMORY ACCESS

FIELD OF THE INVENTION

The present invention is related to an interface circuit and an access method, and particularly to an interface circuit and a method for memory access.

BACKGROUND OF THE INVENTION

The conventional methods used for reading out data stored in a memory include a serial-type method and a parallel-type method.

Figure 1:
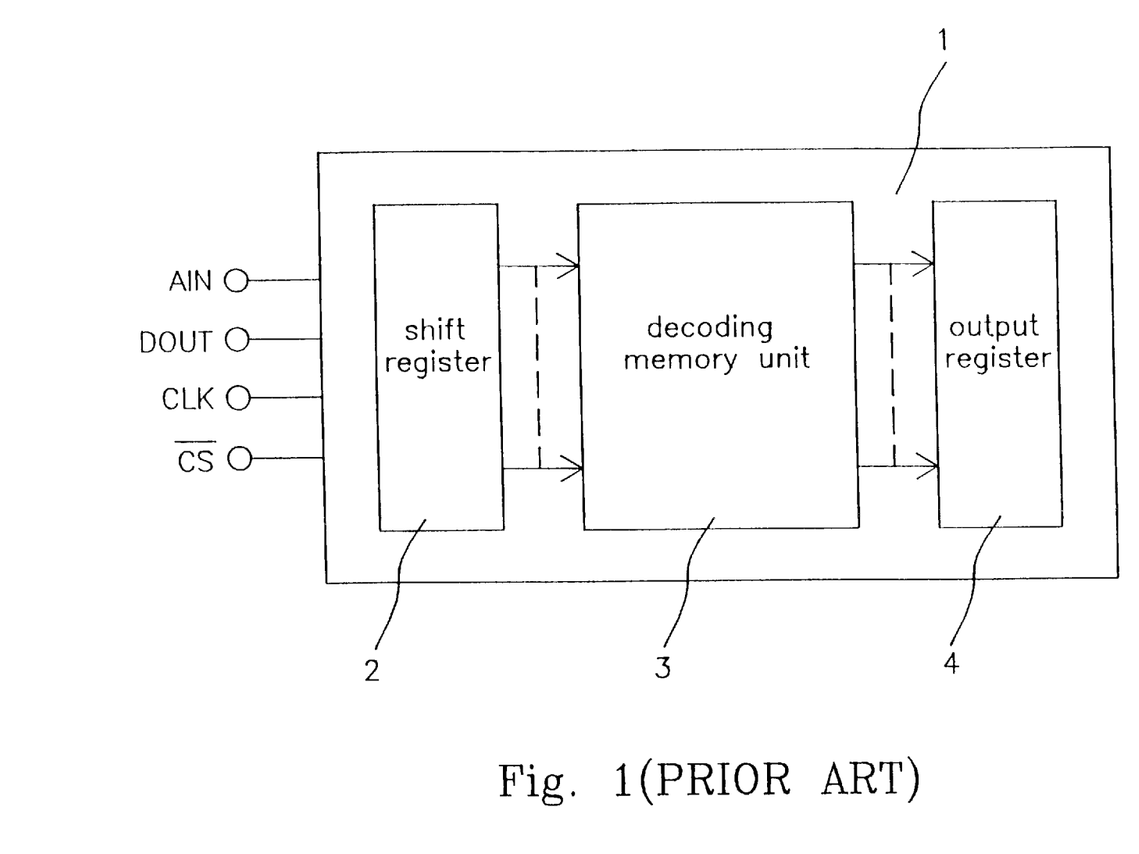
FIG. 1 is a circuit block diagram schematically showing a conventional serial-type method for reading out data stored in a memory.

Please refer to FIG. 1 which is a circuit block diagram schematically showing a conventional serial-type method for reading out data stored in a memory. The devices shown in FIG. 1 are a shift register 2, a decoding memory unit 3 and an output register 4, and these devices 2, 3, 4 are packed in an IC package 1 having pins AIN, DOUT, CLK and $\overline{CS}$. The data to be read out are stored in the decoding memory unit 3.

Figure 2:
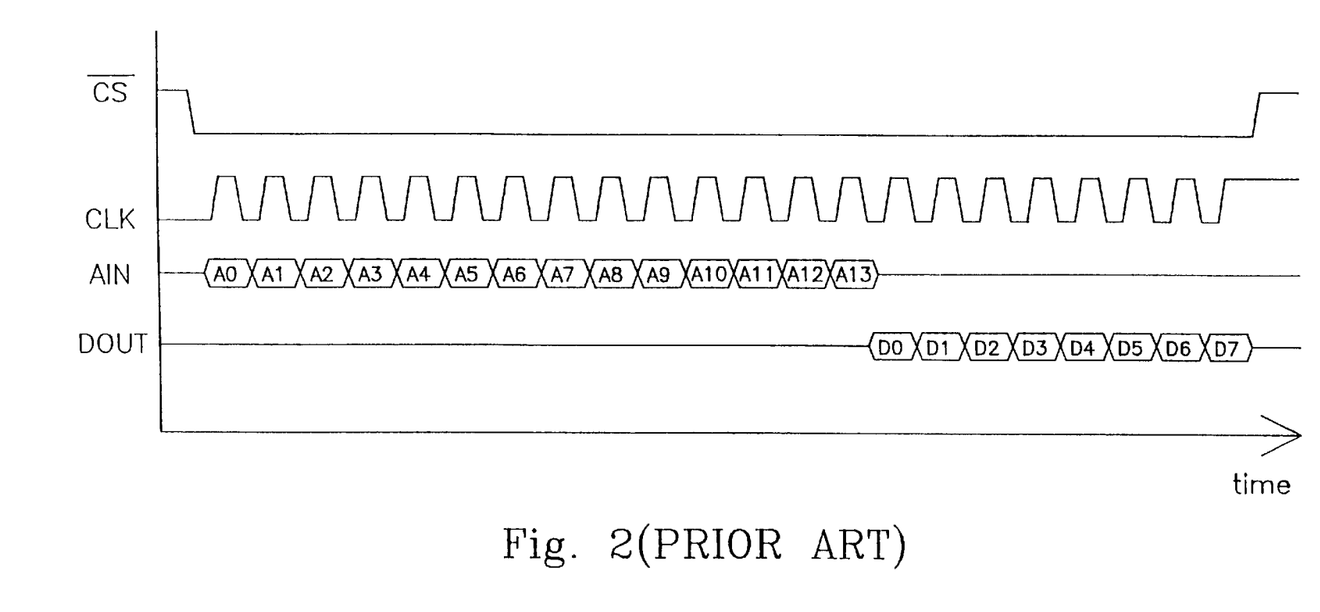
FIG. 2 is a timing chart of the method shown in Fig. 1.

FIG. 2 is a timing chart of the method shown in FIG. 1. The read-out operation will be described as follows with reference to the FIGS. 1 and 2. The circuit in the IC 1 is enabled when the signal transmitted via the pin $\overline{CS}$ is in a "low" state. At this time, a clock is inputted via the pin CLK, an address signal is inputted via the pin AIN, and a data signal is outputted via the pin DOUT later. Assuming that each address in the decoding memory unit 3 is 14-bit, the pin AIN will receive the address signal in a manner that the fourteen bits (A0~A13) are subsequently inputted via the pin AIN one by one, and the shift register 2 also receives the fourteen bits of the address signal one by one. The address signal is further transmitted to the decoding memory unit 3 as a whole after it is completely received by the shift register 2. The address signal is decoded in the decoding memory unit 3 for outputting data D0~D7 corresponding to the address A0~A1 3 to the output register 4. The data D0~D7 are then transmitted by the output register 4 one by one and outputted through the pin DOUT subsequently.

That only one address pin and only one data output pin are needed is an advantage of the serial-type read-out method used in the interface circuit for reading data from the decoding memory unit 3. Therefore, all what has to be done is merely increase the bit-number of each inputted address when the memory capacity of the decoding memory unit 3 is extended. In other words, it is unnecessary to change the pin count of the IC package, and the structure of the external system in cooperation with the IC package does not have to be changed, either. The package cost can thus be economized and the signal count for controlling the IC can be reduced. The serial-type read-out method, however, has a disadvantage of extremely slow read-out rate. Whenever an address bit is inputted or a data bit is outputted, it takes a single pulse of the clock. Owing to a good deal of time-consumption, the serial-type read-out method is suitable only for low-rate reading. In addition, in a case that only eight bits are different between two 32-bit address signals, if the serial-type method is used, both of the two 32-bit address signals have to be completely inputted into the decoding memory unit rather than only the first address signal and the eight different bits of the second address signal are inputted into the decoding memory unit to obtain two corresponding data signals. It is because the input of the address signal and the output of the data signal are controlled by the same clock so that the peripheral control circuit cannot adjust the time of address input and data output according to the different bits of the address signal.

The data to be read out are usually the data having continuous addresses in the decoding memory unit according to conventional memory-data read-out methods. Even though the addresses of two address signals are not continuous, few bits are different between the two address signals in most cases. Under this circumstance, the continuous input of the address signals consisting of consecutive addresses or those having few different bits is inefficient, and the read-out rate is thus reduced.

Figure 3:
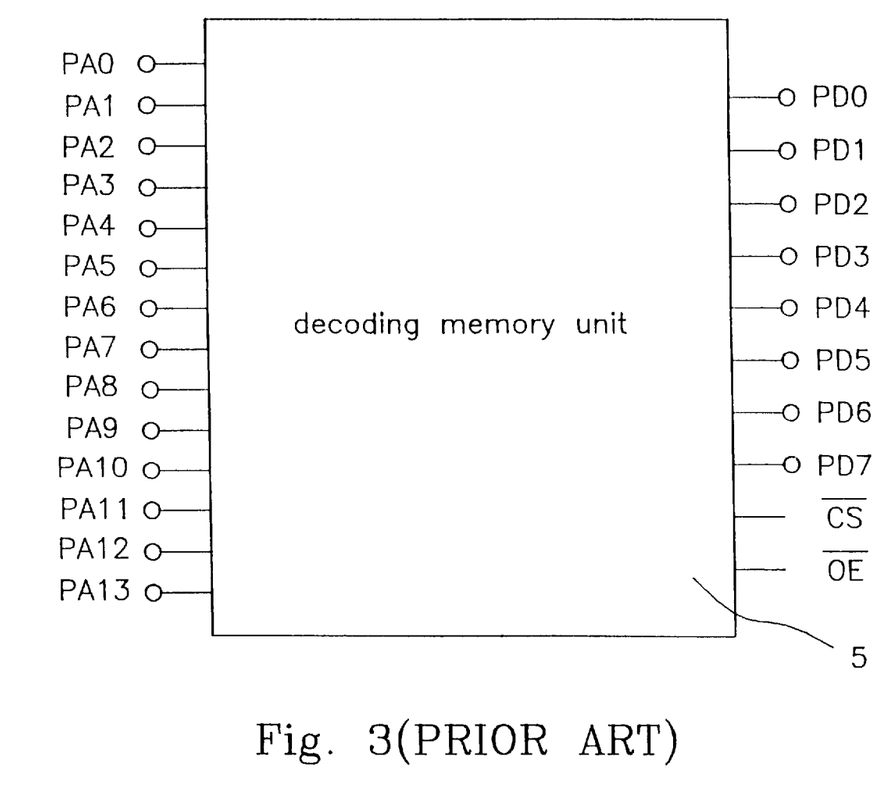
FIG. 3 is a circuit block diagram schematically showing a conventional parallel-type method for reading out data stored in a memory.
Figure 4:
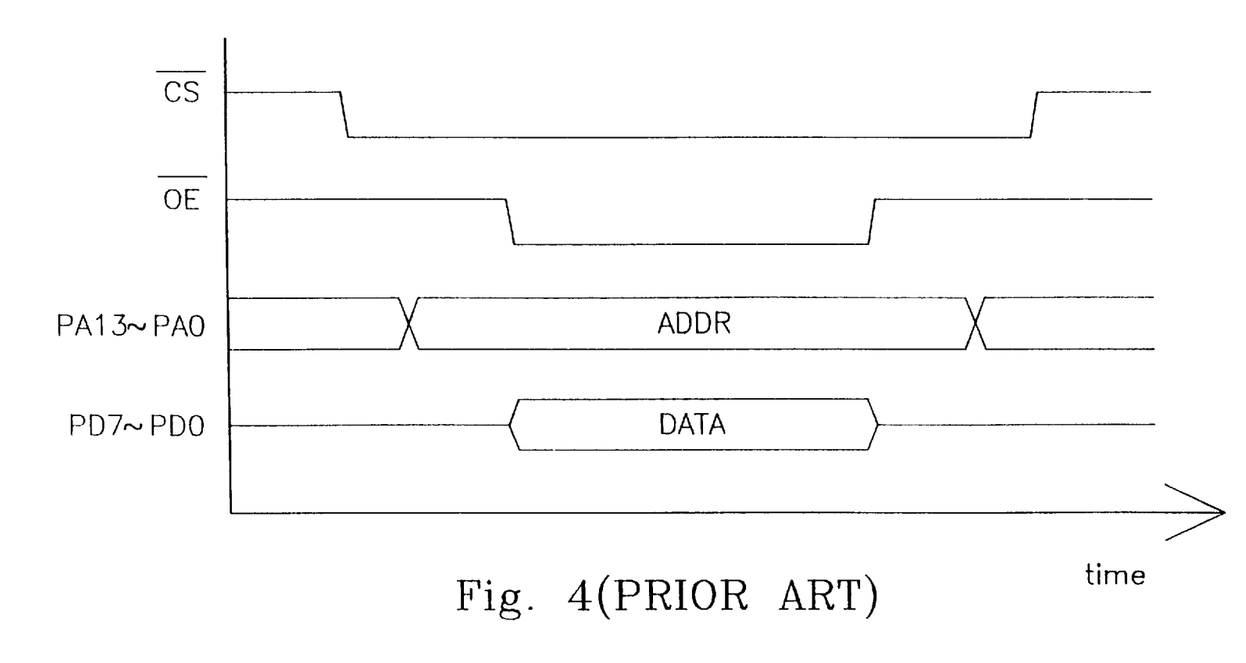
FIG. 4 is a timing chart of the method shown in FIG. 3.

Please refer to FIG. 3 which is a circuit block diagram schematically showing a conventional parallel-type method for reading out data stored in a memory. The device shown in FIG. 3 is a decoding memory unit 5 which has fourteen pins PA0~PA13 simultaneously inputted therethrough the fourteen bits of a 14-bit address signal. After the fourteen address bits are decoded by the decoding memory unit 5, eight corresponding data bits are outputted through eight data-output pins PD0~PD7. In other words, the decoding memory unit 5 has to be equipped with at least fourteen address-input pins and eight data-output pins. In addition to the twenty-two pins mentioned above, the decoding memory device 5 must have a chip-selection pin $\overline{CS}$ and an output-enabling pin $\overline{OE}$. The timing chart of the method illustrated with reference to FIG. 3 is shown in FIG. 4.

The fast read-out rate is an advantage of the parallel-type read-out method. Each bit of the address signal and the data signal is inputted or outputted through a specific pin so that a complete data can be obtained by performing read-out operation only once. Therefore, the read-out rate is fast.

A disadvantage of the parallel-type read-out method is too many pins required so that the package cost is high. Besides, the external control circuit for controlling the decoding memory unit 5 must have pin count at least equivalent to the sum of the address and the data pin counts so that too many control pins of the control circuit are occupied. Further, once the decoding memory unit 5 is required to be extended so that more pins are needed in the decoding memory unit 5, the layout of the peripheral control system will have to be renewedly designed.

SUMMARY OF THE INVENTION

An object of the present invention is to provide an interface circuit and a method for memory access in which the access type for memory data can be flexibly selected.

Another object of the present invention is to provide an interface circuit and a method for memory access in which the access time for memory data can be effectively reduced.

In accordance with the present invention, an interface circuit for transmitting data corresponding to a specific address from/to a decoding memory unit, includes a bit-selection circuit pre-set therein a transmission mode, and a processing circuit electrically connected to the bit-selection circuit for transmitting the data according to the transmission mode. The interface circuit preferably further includes a control circuit electrically connected to the bit-selection circuit and the processing circuit for providing an enabling signal for the processing circuit according to the transmission mode.

In accordance with another aspect of the present invention, the processing circuit includes an address-storing circuit electrically connected to the bit-selection circuit and the control circuit for receiving the address according to the transmission mode and transmitting the address to the decoding memory unit, and a data-transmission buffering device electrically connected to the control circuit and the decoding memory unit for transmitting the data corresponding to the address according to the transmission mode.

In accordance with another aspect of the present invention, the address-storing circuit further includes an address register electrically connected to the control circuit and the decoding memory unit for receiving, storing and outputting the address in response to the enabling signal, and an address-pointer generator electrically connected to the bit-selection circuit for generating at least one pointer according to the transmission mode, and electrically connected to the address register for providing the at least one pointer for the address stored in the address register.

In accordance with another aspect of the present invention, the data-transmission buffering circuit further includes a data buffer electrically connected to the control circuit and the decoding memory unit for receiving, storing and outputting the data in response to the enabling signal, and a data-pointer generator electrically connected to the bit-selection circuit for generating at least one pointer according to the transmission mode, and electrically connected to the data buffer for providing the at least one pointer for the data transmitted through the data buffer. The data buffer can be a uni-directional data buffer transmitting the data from the decoding memory unit, and the decoding memory unit is a Read-Only Memory. On the other hand, the data buffer can be a bi-directional data buffer transmitting the data from/to the decoding memory unit, and the decoding memory unit is a Random Access Memory.

In accordance with another aspect of the present invention, the present interface circuit is packed in an Integrated Circuit together with the decoding memory unit.

According to the present invention, the transmission mode can be a serial mode, a batch mode or a parallel mode.

In accordance with another aspect of the present invention, a method for reading out data corresponding to a specific address from a decoding memory unit, includes steps of: a) inputting a plurality of bits of the address at a time until the address can be identified; b) providing the address for the decoding memory unit to find out the data; and c) outputting the data. The plurality of bits are less than the total bit number of the address.

In the step a), the address can be identified until all bits of the address are inputted. Alternatively, the address can be identified until a part of bits of the address different from those of a preceding address are completely inputted. The step c) preferably further includes steps of: d) reading out the data from the decoding memory unit as a whole; and e) outputting a bit number of the data equal to the plurality of bits of the address at a time until the data are completely outputted.

In accordance with another aspect of the present invention, a method for writing in data corresponding to a specific address to a decoding memory unit, includes steps of: a') inputting a plurality of bits of the address at a time until the address can be identified; b') providing the address for the decoding memory unit; and c') inputting the data to the decoding memory unit at the address. The step c') preferably further includes steps of: d') inputting a plurality of bits of the data at a time until the data are completely inputted; and e') writing in the data to the decoding memory unit as a whole.

The present invention may best be understood through the following description with reference to the accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 5:
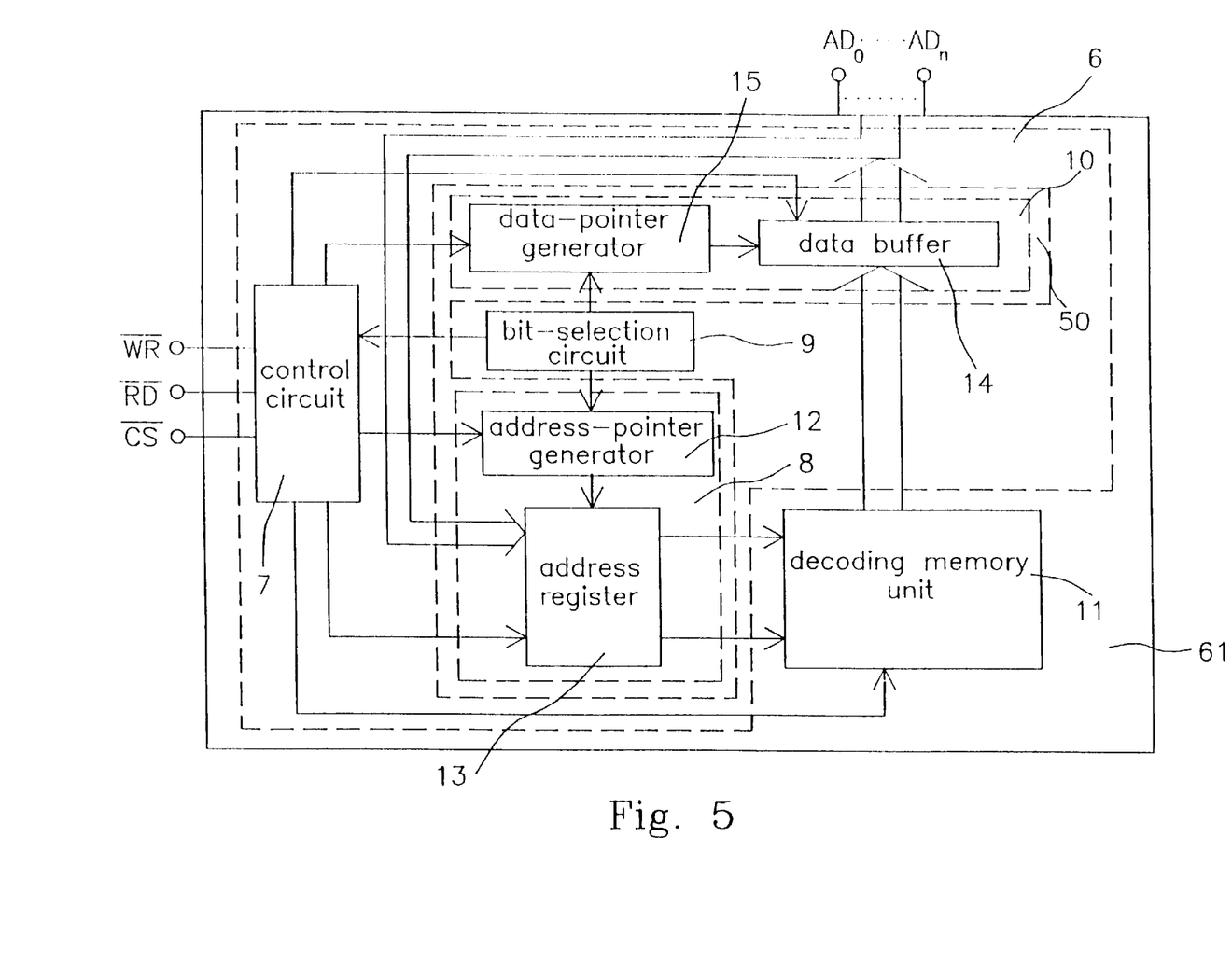
FIG. 5 is a circuit block diagram schematically showing a preferred embodiment of an interface circuit for reading out data stored in a memory according to the present invention.

Please refer to FIG. 5 which is a circuit block diagram schematically showing a preferred embodiment of an interface circuit for reading out data stored in a memory according to the present invention. The interface circuit 6 for reading out data stored in the decoding memory unit 11 includes a control circuit 7, a processing circuit 50 and a bit-selection circuit 9. The processing circuit includes an address-storing circuit 8 and a data-transmission buffering circuit 10. The address-storing circuit 8 includes an address register 13 electrically connected to the control circuit 7 and the decoding memory unit 11, and an address-pointer generator 12 electrically connected to the bit-selection circuit 9, the address register 13, and the control circuit 7. The data-transmission buffering circuit 10 includes a uni-directional data buffer 14 electrically connected the control circuit 7 and the decoding memory unit 11, and a data-pointer generator 15 electrically connected to the bit-selection circuit 9, the uni-directional data buffer 14 and the control circuit 7. In the preferred embodiment shown in FIG. 5, the decoding memory unit 11 is a Read-Only Memory (ROM). The decoding memory unit 11, the control circuit 7, the address storing circuit 8, the bit-selection circuit 9 and the data-transmission buffering circuit 10 are mounted in a single IC package 61 which are equipped with pins $\overline{WR}$, $\overline{RD}$ and $\overline{CS}$ and address/data pins AD0~ADn.

The operation of the interface circuit in FIG. 5 will be described as follows. If the IC 61 has eight address/data pins, i.e. n=7, which are all used, each address signal concerned is 32-bit, and each address corresponds to a 16-bit data in the decoding memory unit 11, eight bits of a 32-bit address signal can be inputted at a time. In this case, the input of the entire address signal is accomplished by performing the above operation four times. It is called a "batch" transmission mode. Meanwhile, the address-pointer generator 12 generates a plurality of address pointers according to the n value determined in the bit-selection circuit 9. In order that the address register 13 can store therein the eight bits of the address signal according to the address indicated by a first address pointer, the control circuit 7 has the address-pointer generator 12 output the first address pointer to the address register 13 when the first eight bits of the address signal are inputted through the pins AD0~AD7, respectively. In order that the address register 13 can store therein the eight bits of the address signal according to the address indicated by a second address pointer, the control circuit 7 has the address-pointer generator 12 output the second address pointer to the address register 13 when the second eight bits of the address signal are inputted through the pins AD0~AD7, respectively. The rest can be deduced in the same manner. After the thirty-two bits of the address signal are all stored in the address register 13, the control circuit 7 has the address register 13 transmit the address signal to the decoding memory unit 11 and enables the decoding memory unit 11 to decode the address signal. The decoding memory unit 11 parallelly outputs the sixteen bits of a 16-bit data corresponding to the address signal to the uni-directional data buffer 14 at a time. The data-pointer generator 15 generates a plurality of data-output pointers according to the n value set in the bit-selection circuit 9. The control circuit 7 has the data-pointer generator 15 transmit the first data-output pointer to the uni-directional data buffer 14 to control the bit number outputted by the uni-directional data buffer 14 at a time. Because n is equal to 7, the 16-bit data in the uni-directional data buffer 14 should be divided into two 8-bit groups which are subsequently outputted through the pins AD0~AD7. In this manner, a data read-out cycle for a specific address signal is accomplished.

Figure 6:
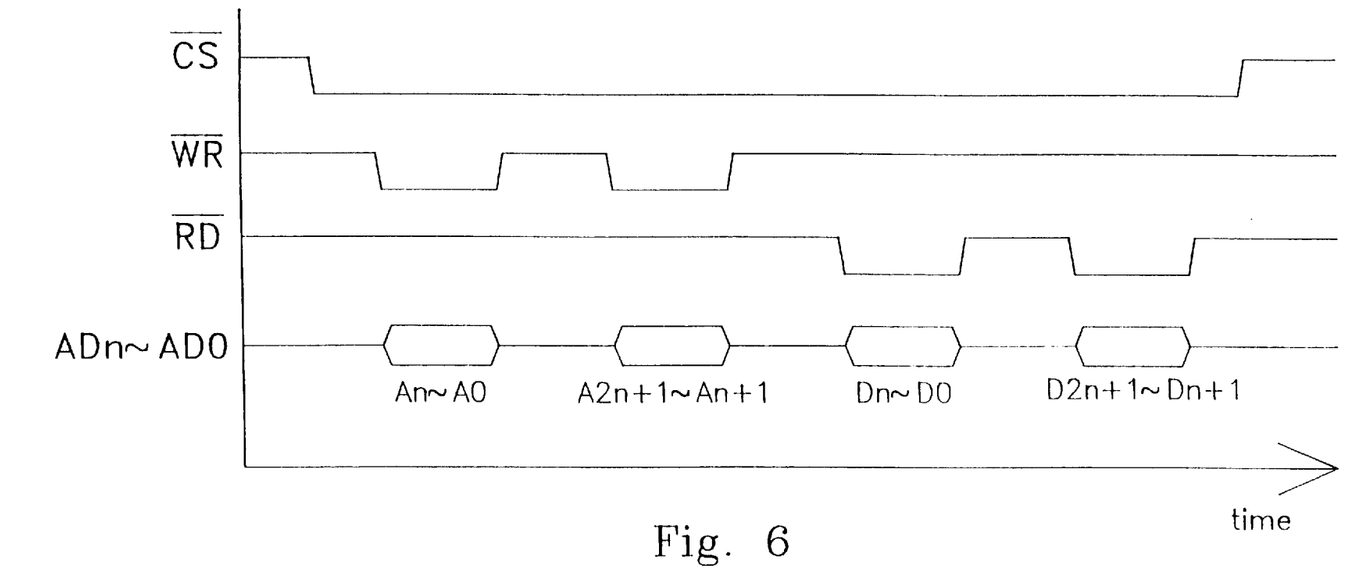
FIG. 6 is a timing chart showing the input/output states at the pins of the interface circuit shown in FIG. 5.

Please refer to FIG. 6 which is a timing chart showing the input/output states at the pins of the interface circuit shown in FIG. 5. When the signal inputted through the pin $\overline{CS}$ is in a "low" state, the circuit of the IC 61 is enabled. An address signal is allowed to be inputted from external when the signal transmitted via the pin $\overline{WR}$ is in a "low" state. Data are allowed to be outputted when the signal transmitted via the pin $\overline{RD}$ is in a "low" state. In FIG. 6, the symbols A0~A2n+1 represent address bits and D0~D2n+1 represent data bits.

Two signals transmitted via the pins $\overline{WR}$ an $\overline{RD}$ are provided in the present invention for serving as clock signals of address input and data output, respectively. Therefore, the peripheral control circuit can opportunely adjust the address-input and data-output clocks according to the address change.

According to the present invention, when data corresponding to a specific address signal are completely read out, the count in the address register 13 will automatically increase to correspond to the next address in the decoding memory unit 11. Accordingly, if the data to be read by the peripheral controller are those corresponding to continuous addresses, the peripheral controller can repetitively enable the signal for the pin $\overline{RD}$ after the first data corresponding to the first address is read out to subsequently read out other data corresponding to the continuous addresses without inputting each of the continuous addresses. By this way, the input time for the subsequent address signals will be significantly reduced.

Whenever an address signal is completely inputted, the state of the signal for the pin $\overline{WR}$ will become "high", and the address-pointer generator 12 will be zeroed by the control circuit 7. Whenever data corresponding to a specific address signal is completely read out, the state of the signal for the pin $\overline{RD}$ will become "high", and the data-pointer generator 15 will be zeroed by the control circuit 7. Therefore, in a case that only the lowest byte is different between two address signals, the second address signal can be identified as soon as the first eight bits of the second address signal is inputted. The reason for the above conclusion is described as follows. The address-pointer generator 12 has been zeroed before the eight bits of the second address signal are inputted so that the inputted eight address bits must be the lowest byte of the second address signal. In addition, the other bytes of the second address signal are identical to those of the first address signal, so the second address signal can be identified only by inputting the different lowest byte. Then, the signal for the pin $\overline{RD}$ is converted into a "low" state by the external controller to perform the data read-out operation.

Figure 7:
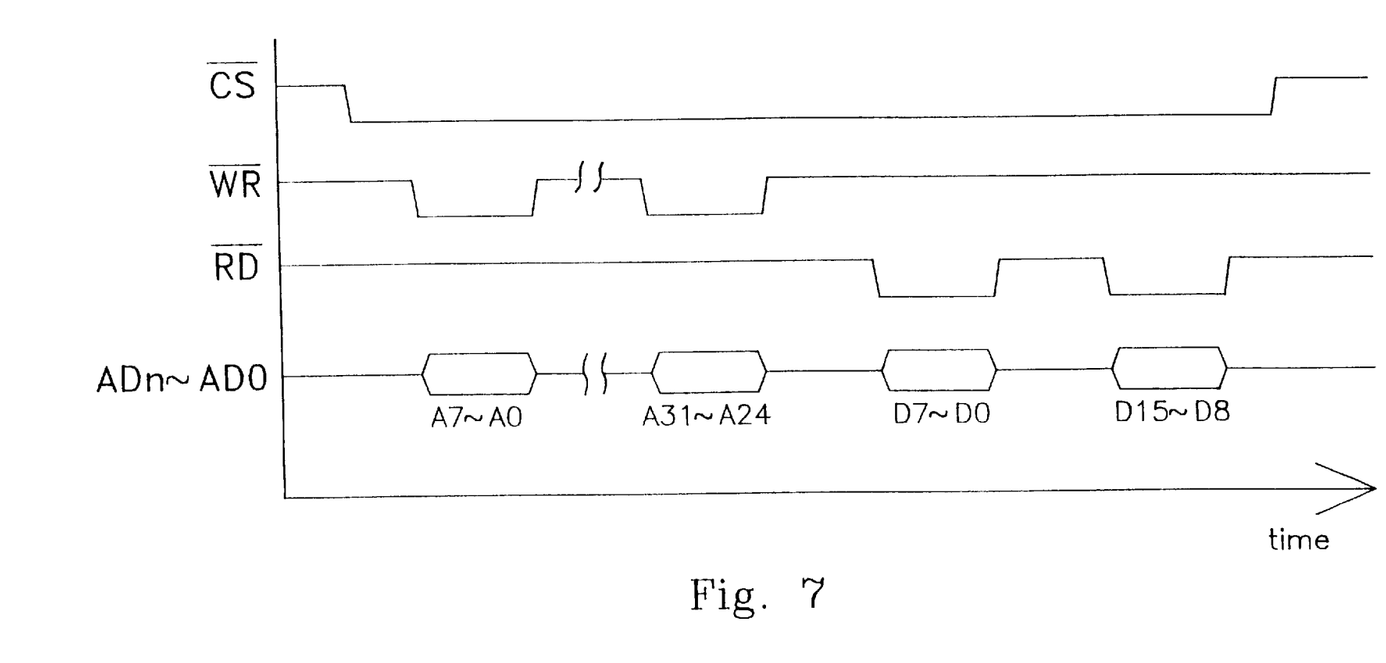
FIG. 7 is a timing chart showing the input/output states at the pins of the interface circuit shown in FIG. 5 wherein n is equal to 7.
Figure 8:
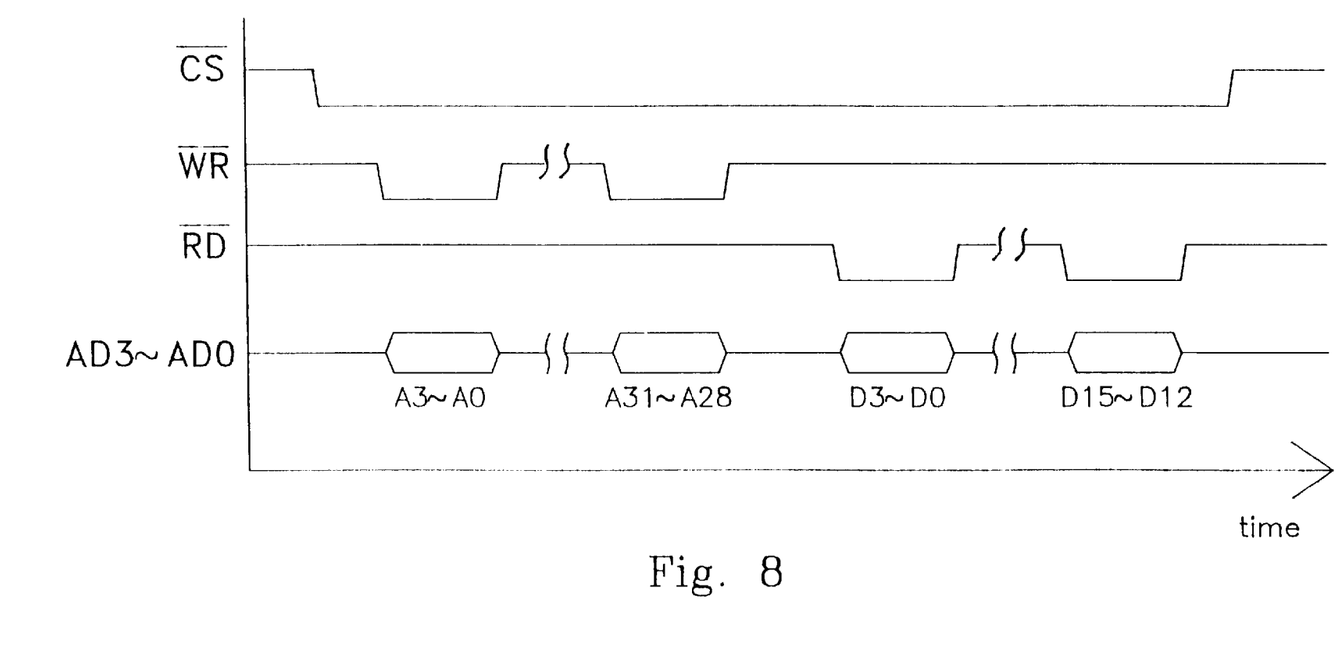
FIG. 8 is a timing chart showing the input/output states at the pins of the interface circuit shown in FIG. 5 wherein n is equal to 3.
Figure 9:
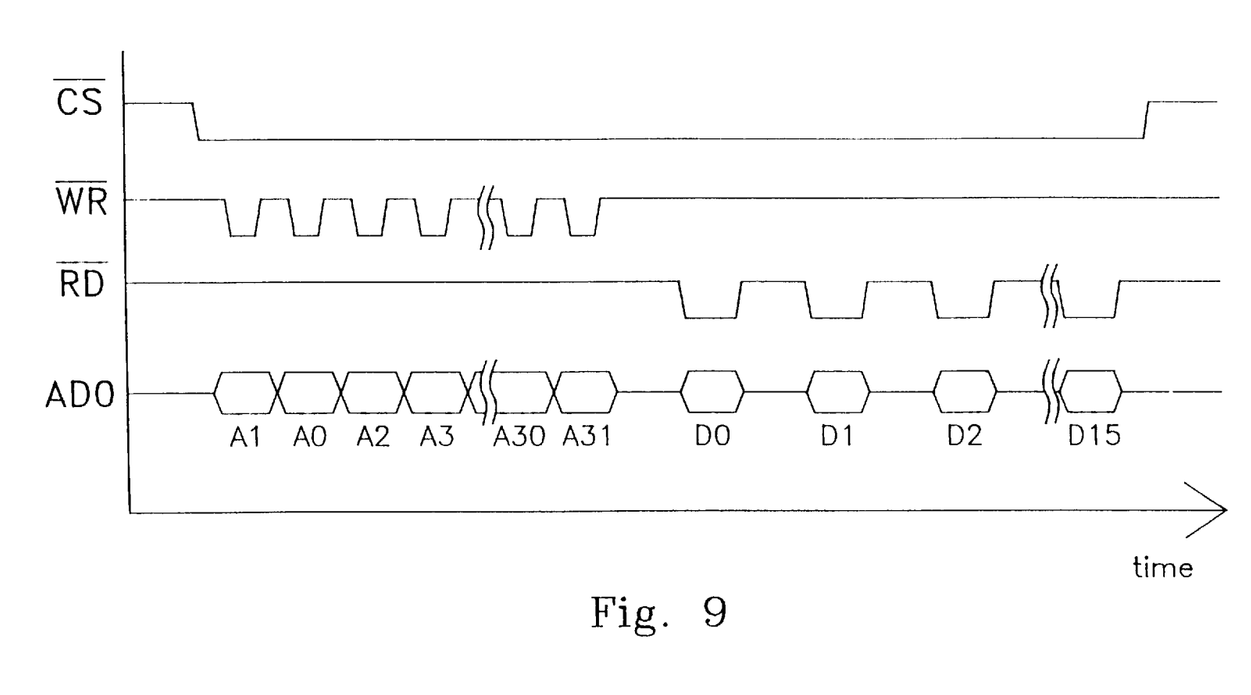
FIG. 9 is a timing chart showing the input/output states at the pins of the interface circuit shown in FIG. 5 wherein n is equal to 0.

Please refer to FIGS. 7~9 which are timing charts showing the input/output states at the pins of the interface circuit shown in FIG. 5. In the figures, the n values are equal to 7, 3 (batch mode) and 0 (serial mode), respectively, A0~A31 are addresses bits, and D0~D15 are data bits corresponding to the addresses bits A0~A31. Of course, the IC 61 can equipped with eight address/data pins, but only a part of the pins, e.g. four or one, are electrically connected to the external controller. The effect is equivalent to that of 4 address/data pins or 1 address/data pin. On the other hand, under this circuit structure, the present invention becomes parallel-mode if the inputted address is 8-bit.

Figure 10:
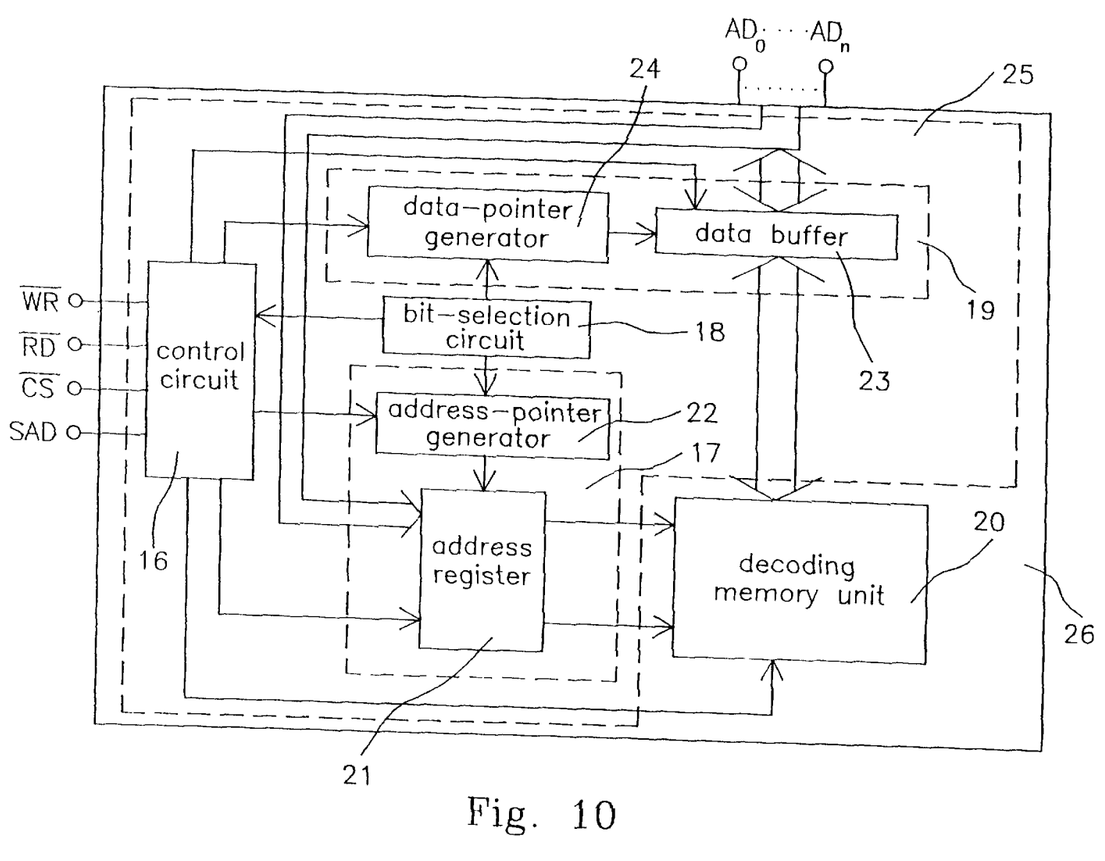
FIG. 10 is a circuit block diagram schematically showing a preferred embodiment of an interface circuit for memory access according to the present invention.

FIG. 10 is a circuit block diagram schematically showing a preferred embodiment of an interface circuit for memory access according to the present invention. The interface circuit 25 for accessing data in a decoding memory unit 20 includes a control circuit 16, an address-storing circuit 17, a bit-selection circuit 18 and a data-transmission buffering circuit 19, and is mounted in an IC package 26. The address-storing circuit 17 includes an address register 21 and an address-pointer generator 22. The data-transmission buffering circuit 19 includes a bi-directional data buffer 23 and a data-pointer generator 24. The difference between the circuits in FIGS. 5 and 10 lies in that the decoding memory unit 11 in FIG. 5 is a Read-Only Memory (ROM), while the decoding memory unit 20 in FIG. 10 is a Random Access Memory (RAM). That is, the preferred embodiment shown in FIG. 10 functions both in reading out and writing in. Owing to this difference, the data buffers used in the two preferred embodiments are a uni-directional one and a bi-directional one, respectively.

In order to comply with the write-in situation, the IC 26 has an additional pin SAD connected to the control circuit 16, as compared to the read-only situation. When the interface circuit 25 is in a read-out operation state, the pin SAD is null. In FIG. 10, the same circuits as those in FIG. 5 function the same as in FIG. 5.

When the interface circuit is in a write-in operation, the high state and the low state of the signal transmitted via SAD are used for actuating the input of an address signal and the input of a data signal. For example, it is an address signal inputted when the signal for the pin SAD is in a "high" state, while it is a data signal inputted when the signal for the pin SAD is in a "low" state. The process for the input of an address signal is executed in a manner similar to the process described with reference to FIG. 5 and the address signal is stored in the address register 21. When the inputted signal is a data signal, the control circuit 16 has the signal-transmission direction of the bi-directional buffer 23 to transmit the data signal inputted through the address/data pins AD~AD7 and stored therein to the decoding memory unit 20. The data are stored in the decoding memory unit 20 at the address determined by the address register 21.

In brief, according to the present invention, the read-out time can be significantly reduced owing to a plurality of bits of an address signal can be simultaneously inputted through address/data pins. Further, in a case that data to be read out correspond to continuous addresses, the complete input of the continuous addresses except the first one is not required. Moreover, if there are only a few bits different between two address signals, only does the different part of address bits have to be inputted to find out the data corresponding to the second address signal.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An interface circuit for transmitting data corresponding to a specific address from a read-only memory unit, said interface circuit comprising:

a bit-selection circuit pre-set in a transmission mode;

a processing circuit electrically connected to said bit-selection circuit for transmitting said data according to said transmission mode; and a control circuit electrically connected to said bit-selection circuit and said processing circuit for providing an enabling signal for said processing circuit according to said transmission mode;

wherein said processing circuit includes:

an address-storing circuit electrically connected to said bit-selection circuit and said control circuit for receiving said address according to said transmission mode and for transmitting said address to said read-only memory unit; and a data-transmission buffering device electrically connected to said control circuit and said read-only memory unit for transmitting said data corresponding to said address according to said transmission mode;

wherein said address-storing circuit further includes:

an address register electrically connected to said control circuit and said read-only memory unit for receiving, storing and outputting said address in response to said enabling signal;

an address-pointer generator electrically connected to said bit-selection circuit for generating at least one pointer according to said transmission mode, and electrically connected to said address register for providing said at least one first pointer for said address stored in said address register;

wherein said data-transmission buffering circuit further includes:

a data buffer electrically connected to said control circuit and said read-only memory unit for receiving, storing and outputting said data in response to said enabling signal; and a data-pointer generator electrically connected to said bit-selection circuit for generating at least one pointer according to said transmission mode, and electrically connected to said data buffer for providing said at least one second pointer for said data transmitted through said data buffer, wherein said data buffer is a uni-directional data buffer transmitting said data from said read-only memory unit.

2. A method for reading out data corresponding to a specific address from a read-only memory unit, said method comprising steps of:

a) inputting a plurality of bits of said address at a time until said address can be identified;

b) providing said identified address for said read-only memory unit to find out said data; and c) outputting said data, wherein, in said step a), said address can be identified until all bits of said address are inputted, wherein, in said step a), said address can be identified until a part of bits of said address different from those of a preceding address are completely inputted, wherein said step c) further includes steps of:

d) reading out said data as a whole from said read-only memory unit; and e) outputting a bit number of said data equal to said plurality of bits of said address at a time until said data are completely outputted.

* * * * *